(12) United States Patent
Kang et al.

(10) Patent No.: US 7,516,545 B2
(45) Date of Patent: Apr. 14, 2009

(54) METHOD OF MANUFACTURING PRINTED CIRCUIT BOARD HAVING LANDLESS VIA HOLE

(75) Inventors: Myung Sam Kang, Daejeon (KR); Shuhichi Okabe, Daejeon (KR); Jung Hyun Park, Chungcheongbuk-do (KR); Hoe Ku Jung, Daejeon (KR); Ji Eun Kim, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 246 days.

(21) Appl. No.: 11/591,586

(22) Filed: Nov. 2, 2006

(65) Prior Publication Data

US 2007/0130761 A1 Jun. 14, 2007

(30) Foreign Application Priority Data

Dec. 14, 2005 (KR) ...................... 10-2005-0123206

(51) Int. Cl.
*H01K 3/10* (2006.01)
*H05K 3/02* (2006.01)

(52) U.S. Cl. .............................. 29/852; 29/825; 29/830; 29/846; 216/20; 216/41

(58) Field of Classification Search .................. 29/825, 29/830, 846, 852; 216/20, 41
See application file for complete search history.

(56) References Cited

U.S. PATENT DOCUMENTS

| 3,799,802 | A | * | 3/1974 | Schneble, Jr. et al. | ........ 205/126 |
| 4,704,791 | A | * | 11/1987 | Chellis et al. | .................. 29/852 |
| 5,284,548 | A | * | 2/1994 | Carey et al. | .................... 216/18 |
| 5,510,580 | A | | 4/1996 | Shirai et al. | |
| 2007/0130761 | A1 | * | 6/2007 | Kang et al. | .................... 29/830 |

FOREIGN PATENT DOCUMENTS

| JP | 6-310865 | 11/1994 |
| JP | 10-173337 | 6/1998 |
| JP | 2003-309356 | 10/2003 |
| JP | 2005-123555 | 5/2005 |

OTHER PUBLICATIONS

Japanese Patent Office Action, mailed May 9, 2008 and issued in corresponding Japanese Patent Application No. 2006-329110.

* cited by examiner

*Primary Examiner*—C. J Arbes

(57) ABSTRACT

Disclosed is a method of manufacturing a printed circuit board having a landless via hole. Specifically, this invention provides a method of manufacturing a printed circuit board having a landless via hole without the upper land of a via hole using a photoresist (P-LPR) which is loaded in the via hole. Therefore, in this invention, since a circuit pattern is formed using only copper of a copper clad laminate, the width thereof is minimized, thus easily realizing a fine circuit pattern. Further, the landless via hole structure is applied, resulting in a highly dense circuit pattern.

12 Claims, 9 Drawing Sheets

METHOD OF MANUFACTURING PRINTED CIRCUIT BOARD HAVING LANDLESS VIA HOLE

CROSS REFERENCE TO RELATED APPLICATION(S)

This application claims the benefit of Korean Patent Application No. 10-2005-0123206, filed Dec. 14, 2005, entitled "Manufacturing method of printed circuit board with landless via hole", which is hereby incorporated by reference in its entirety into this application.

BACKGROUND OF THE INVENTION

1. Field of the Invention

The present invention relates to a method of manufacturing a printed circuit board (PCB) having a landless via hole, and more particularly, to a method of manufacturing a PCB having a landless via hole without the upper land of a via hole, using a photoresist (P-LPR) which is loaded in the via hole.

2. Description of the Related Art

With the development of electronic industries, an increase in the functionality of electronic parts and a decrease in the size thereof are increasingly required. In order to satisfy such requirements, PCBs also need a highly dense circuit pattern, thus various methods of realizing a fine circuit pattern have been devised and applied.

Among methods of forming a fine circuit pattern, the present invention adopts a method of realizing a highly dense circuit pattern having a landless via hole by removing the upper land of a via hole.

FIG. 1 is a perspective view schematically showing a conventional PCB 100 having a landless via hole, which was disclosed in U.S. Pat. No. 5,510,580 (granted on 23 Apr. 1996).

As shown in FIG. 1, a conventional PCB 100 is provided with a via hole structure having no upper land by forming a blind via hole 12 in the surface of a substrate 10 having an inner layer circuit 40 to connect it to the inner layer circuit 40 of the substrate 10, forming a conductive layer 32 on the inner wall of the blind via hole 12, and directly connecting the conductive layer to a circuit pattern 22 on the surface of the substrate.

Below, the method of manufacturing the PCB of FIG. 1 is briefly described with reference to the flowchart of FIG. 2.

As shown in FIGS. 1 and 2, the base substrate 10 having the inner layer circuit 40 is provided (S10), and the blind hole 12 is processed in the surface of the base substrate 10 so as to be connected to the inner layer circuit 40 of the base substrate 10 (S12). Subsequently, a conductive layer is formed on the surface of the base substrate including the blind hole 12 (S14).

Then, a photoresist is formed in the blind hole 12 (S16). As such, the photoresist is exemplified by a positive liquid photoresist (P-LPR). The photoresist is applied on the entire surface of the base substrate, cured, and exposed in a state of the portion thereof corresponding to the blind hole being masked, such that the photoresist remains only in the blind hole.

Thereafter, the conductive layer, which is formed on the surface of the base substrate 10, is removed. In this case, the conductive layer, which is present in the blind hole, is protected by the remaining photoresist (S18). Then, the photoresist, which remains in the blind hole, is removed (S20).

Subsequently, additional photolithography is conducted to thus form a circuit pattern 22 on the surface of the base substrate 10 (S22), thereby forming a PCB 200 having a landless via hole. As such, the circuit pattern 22 is characterized in that no upper land is formed around the blind hole 12.

Such a conventional PCB is advantageous in that no upper land need be formed. However, since a series of exposure and development processes is repeatedly performed in the processes of forming the conductive layer in the blind hole and of forming the circuit pattern on the surface of the base substrate, the manufacturing process is complicated, thus increasing the cost and process time period.

SUMMARY OF THE INVENTION

Accordingly, an object of the present invention is to provide a PCB having a landless via hole.

Another object of the present invention is to provide a highly dense circuit pattern by realizing a via hole structure having no upper land.

A further object of the present invention is to provide a method of manufacturing a PCB having a landless via hole.

In accordance with a first embodiment of the present invention for accomplishing the above objects, a method of manufacturing a PCB having a landless via hole is provided, comprising (A) providing a base substrate composed of a copper clad laminate (CCL); (B) etching part of the copper foil of the CCL, to thus form a circuit pattern including a through hole; (C) sequentially forming a seed layer, a second metal layer having etching conditions different from those of copper, and a copper plating layer on the entire surface of the base substrate having the circuit pattern; (D) filling the through hole with a photoresist; (E) sequentially removing the copper plating layer, the second metal layer, and the seed layer; and (F) removing the photoresist from the through hole; wherein the circuit pattern has a predetermined thickness corresponding to that of the copper foil.

In the first embodiment of the present invention, the predetermined thickness of the circuit pattern may be about 12~18 μm, and the width thereof may be about 20 μm.

In the first embodiment of the present invention, (D) may comprise (D-1) applying the photoresist on the entire surface of the base substrate and in the through hole; and (D-2) exposing the photoresist to a depth corresponding to a thickness thereof, and performing development, to thus remove the photoresist from the surface of the base substrate.

In the first embodiment of the present invention, the exposure of the photoresist may be performed by controlling the exposure amount such that the photoresist is exposed to a depth corresponding to the thickness thereof.

In the first embodiment of the present invention, the second metal layer may be a nickel layer.

Further, in accordance with a second embodiment of the present invention, there is provided a method of manufacturing a PCB having a landless via hole, comprising (A) providing a base substrate including an inner layer circuit and composed of CCL; (B) forming a circuit pattern, having a blind hole which is connected to the inner layer circuit of the base substrate, on the surface of the base substrate; (C) sequentially forming a seed layer, a second metal layer having etching conditions different from those of copper, and a copper plating layer on the entire surface of the base substrate having the circuit pattern; (D) filling the blind hole with a photoresist; (E) sequentially removing the copper plating layer, the second metal layer, and the seed layer; and (F) removing the photoresist from the blind hole; wherein the circuit pattern has a predetermined thickness corresponding to that of the copper foil of the CCL.

In the second embodiment of the present invention, the predetermined thickness of the circuit pattern may be about 12~18 μm, and the width thereof may be about 20 μm.

In the second embodiment of the present invention, (D) may comprise (D-1) applying the photoresist on the entire surface of the base substrate and in the blind hole; and (D-2) exposing the photoresist to a depth corresponding to the thickness thereof, and performing development, thereby removing the photoresist from the surface of the base substrate.

In the second embodiment of the present invention, the exposure of the photoresist may be performed by controlling the exposure amount such that the photoresist is exposed to a depth corresponding to the thickness thereof.

In the second embodiment of the present invention, the second metal layer may be a nickel layer.

DESCRIPTION OF THE PREFERRED EMBODIMENTS

Hereinafter, a detailed description will be given of the present invention, with reference to the appended drawings.

Figure 1:
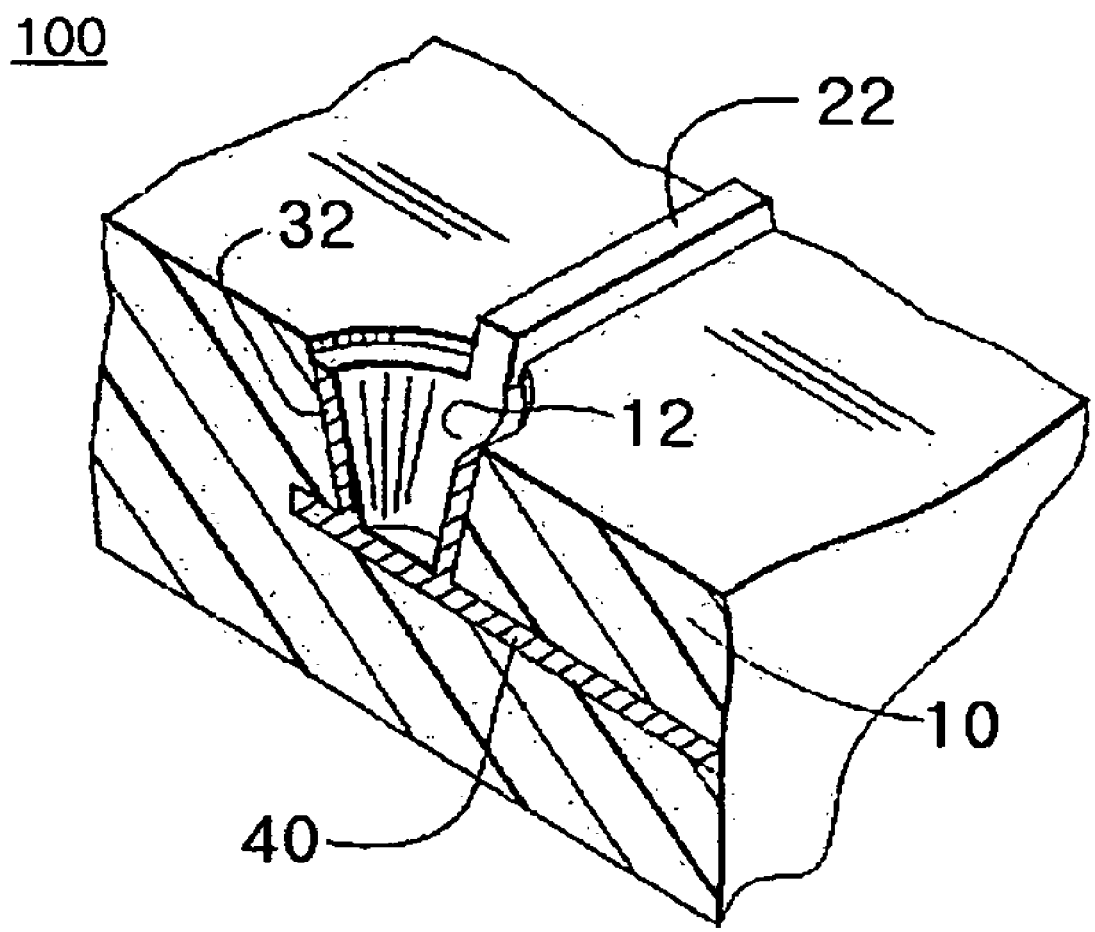
FIG. 1 is a perspective view schematically showing a conventional PCB having a via hole.
Figure 2:
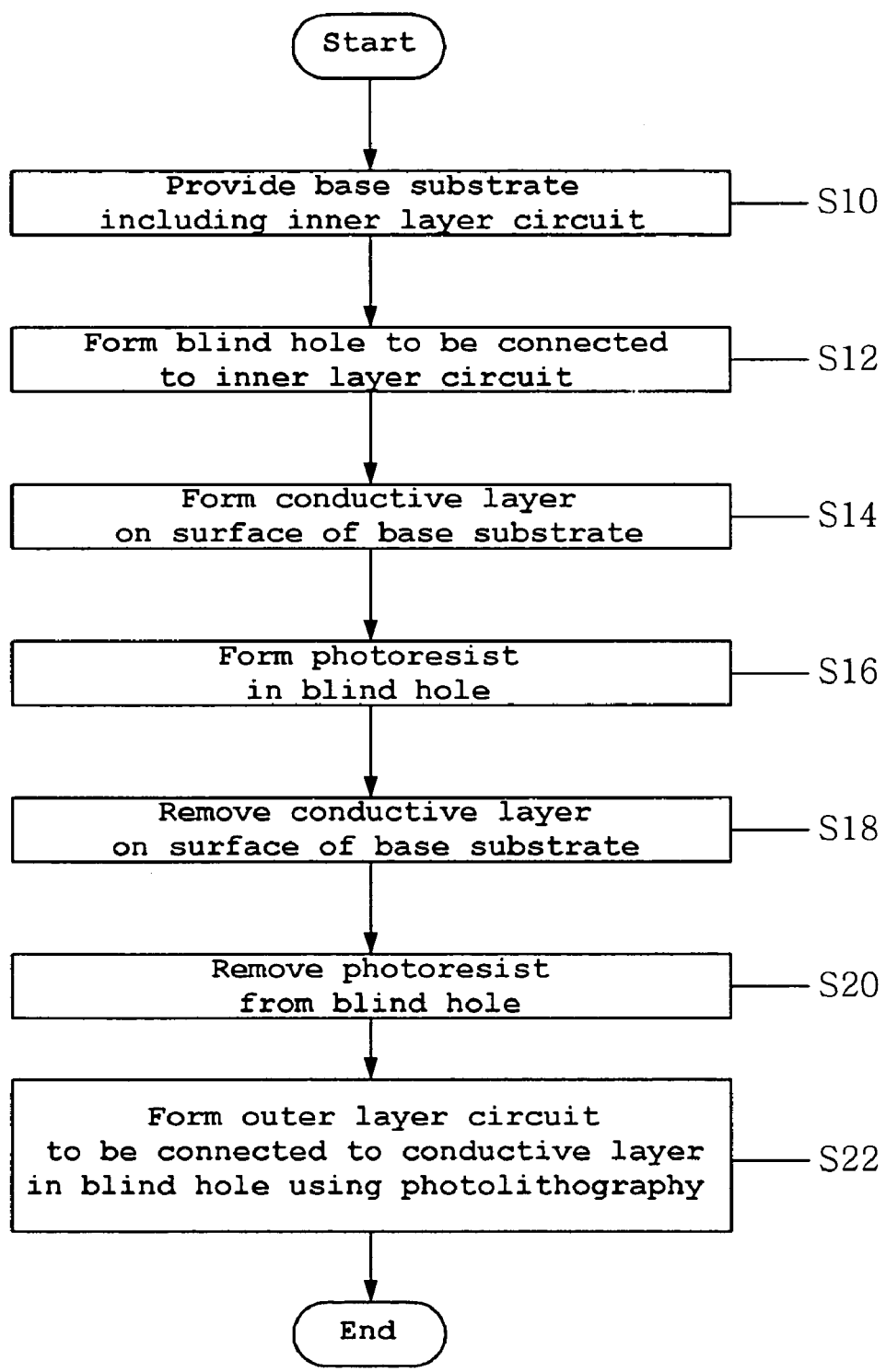
FIG. 2 a flowchart schematically showing the process of manufacturing the PCB of FIG. 1.
Figure 3:
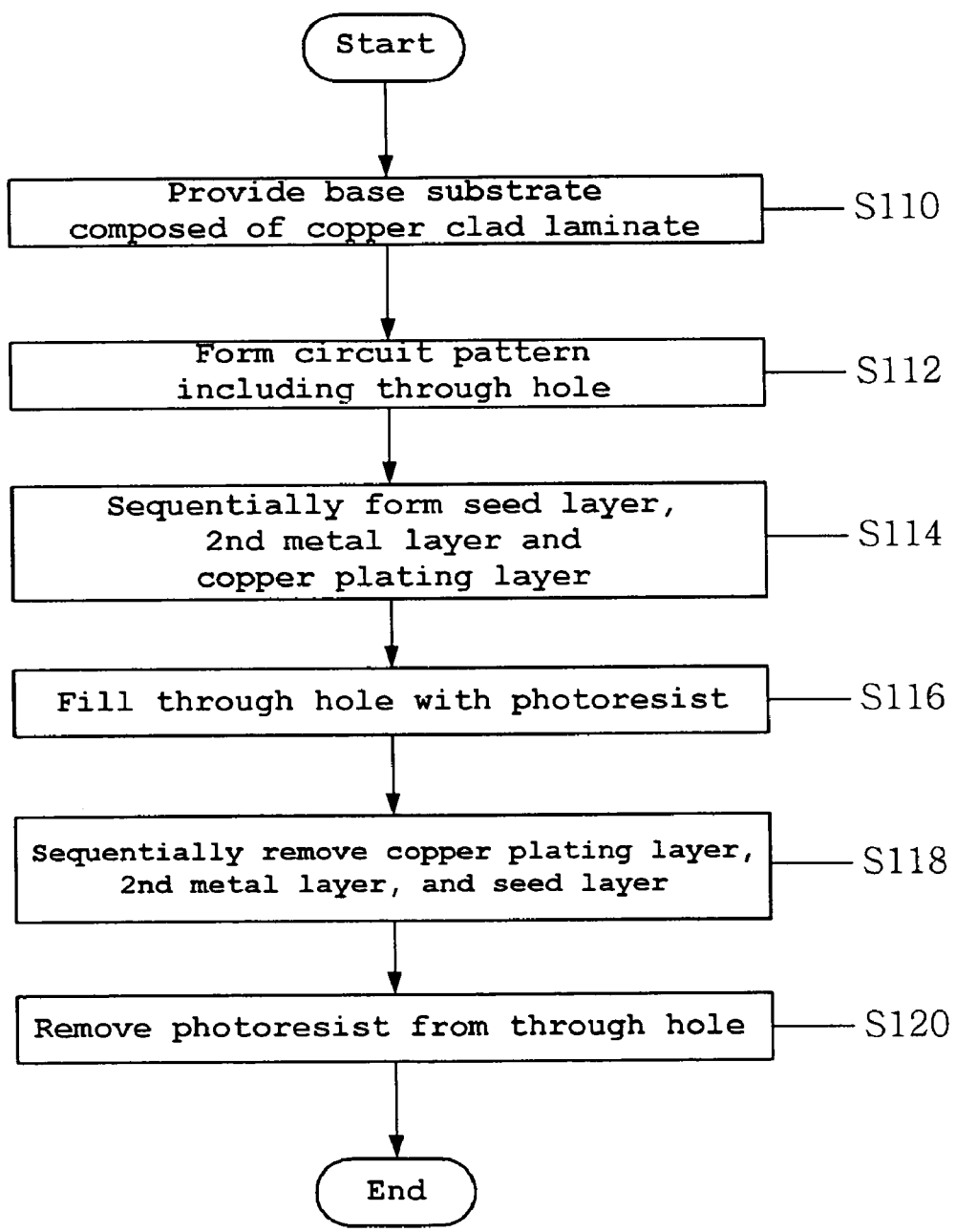
FIG. 3 is a flowchart schematically showing the process of manufacturing a PCB, according to a first embodiment of the present invention.

FIG. 3 is a flowchart showing the process of manufacturing the PCB, according to a first embodiment of the present invention, and FIGS. 4A to 4H are detailed views stepwisely showing the manufacturing process. Below, the method of manufacturing the PCB according to the first embodiment of the present invention is described with reference to the above drawings.

Figure 4A:
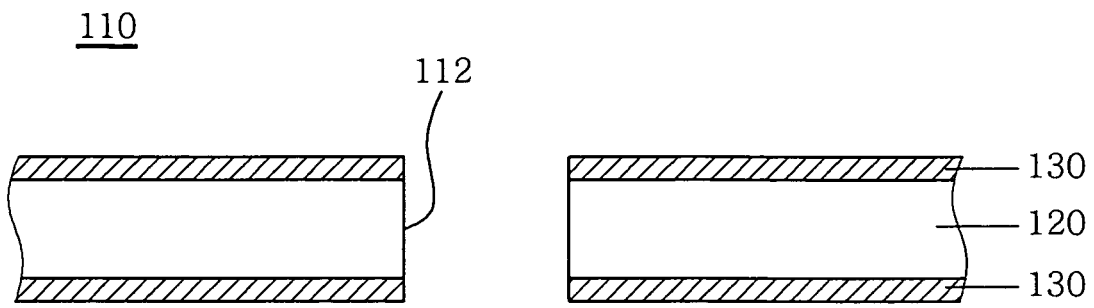
FIGS. 4A to 4H are views sequentially showing the process of manufacturing the PCB of FIG. 3.

As shown in FIG. 4A, a base substrate 110, which is composed of a copper clad laminate (CCL) including an insulating layer 120 and copper foils 130 on both surfaces of the insulating layer, is provided (S110), and a through hole 112 is formed in a predetermined position of the substrate.

Figure 4B:
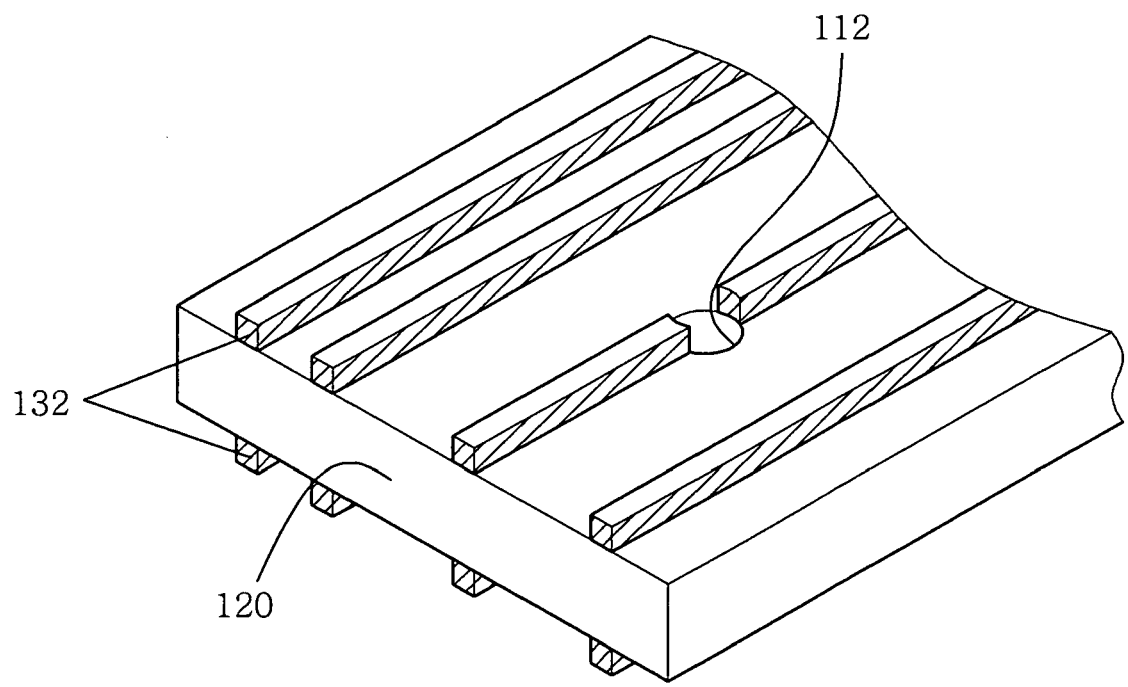

As shown in FIG. 4B, a circuit pattern 132 having the through hole 112 is formed by etching part of the copper foils 130. In such a case, since the copper foil 130 is about 12~18 μm thick, the resulting circuit pattern may have a width of about 20 μm (S112).

Figure 4C:
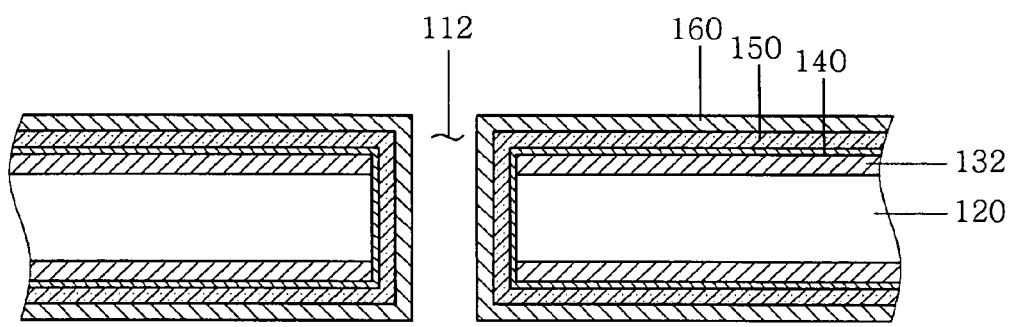

As shown in FIG. 4C, a seed layer 140, a second metal layer 150, and a copper plating layer 160 are sequentially formed on the entire surface of the base substrate 110 including the through hole 112 (S114).

The seed layer 140 is provided to form the second metal layer 150 through electroplating not only on the surface of the base substrate 110 but also in the through hole 112, and the second metal layer is formed of a metal, such as nickel (Ni), which has etching conditions different from those of copper (Cu) for the formation of a circuit pattern. That is, the second metal layer 150 may be formed of any metal which is not etched under the etching conditions of copper (i.e., which is etched using a second metal layer-etching solution that is different from a copper-etching solution). Further, in consideration of a subsequent removal process, it is noted that the second metal layer is formed so as not to be too thick.

Figure 4D:
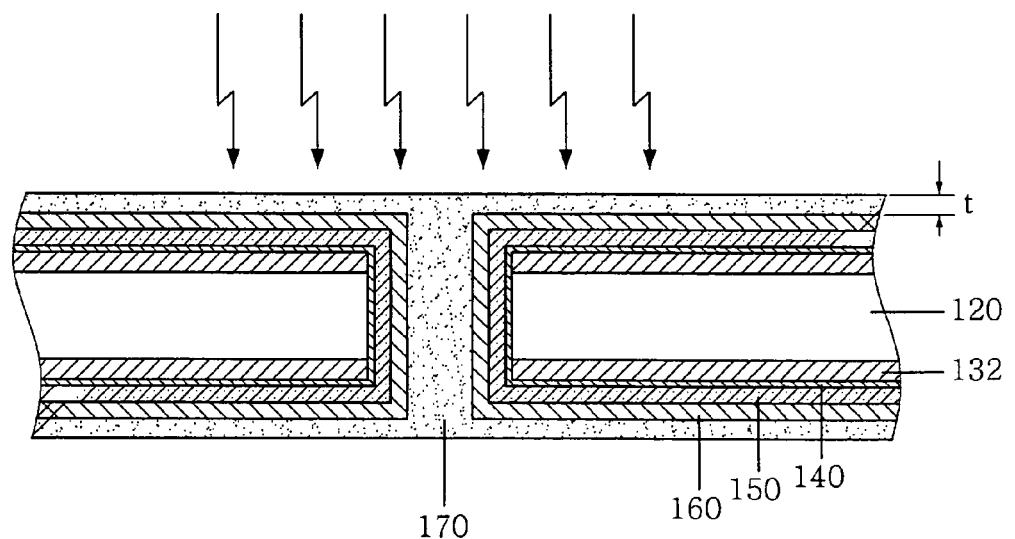

As shown in FIG. 4D, a photoresist 170 is applied on the copper plating layer so that the through hole 112 is also filled therewith, after which an exposure process is performed using a mask (not shown). The applied photoresist 170 is exemplified by P-LPR, which is characterized in that it is applied in a liquid state, cured, exposed to thus change the exposed part, and developed to thus remove the changed part using a developing solution. In this case, the exposure amount is controlled such that the photoresist 170, applied on the copper plating layer, is exposed to a depth corresponding to the thickness t thereof.

Figure 4E:
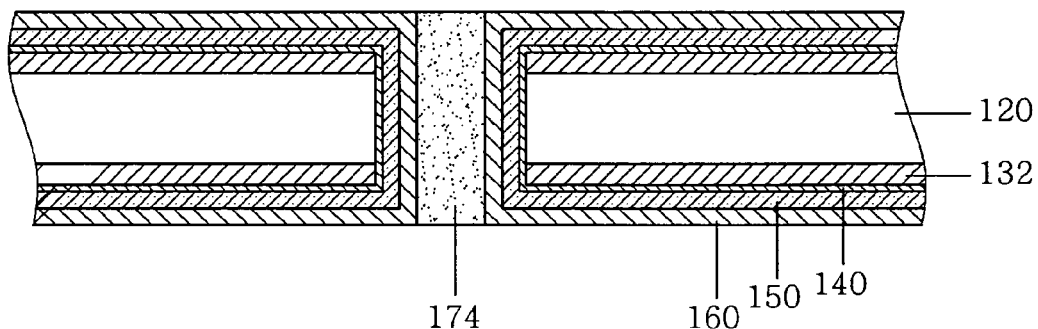

In this way, through the control of the exposure amount, as shown in FIG. 4E, a part of the photoresist 170, which is changed due to exposure, is removed through development using a developing solution, the other part 174 of which remains in a state of being loaded in the through hole 112 (S116).

Figure 4F:
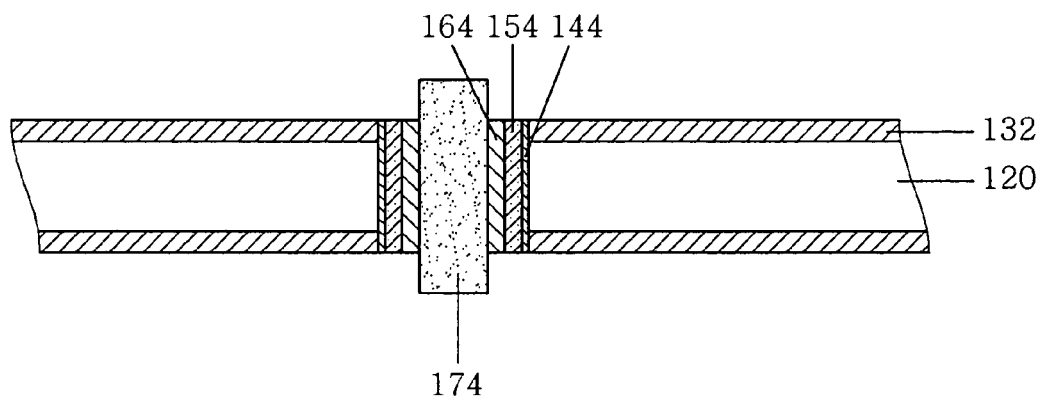

As shown in FIG. 4F, using the remaining photoresist 174 as a mask, the copper plating layer 160, the second metal layer 150 and the seed layer 140 are sequentially removed. Since the copper plating layer 160 and the second metal layer 150 are etched under conditions that are different from each other, the removal process is actually conducted three tires. During the individual removal processes, the circuit pattern 132 is intended to be electrically connected to a copper plating layer 164, a second metal layer 154, and a seed layer 144 in the through hole 112 (S118).

Although the circuit pattern 132 is not shown in as being directly connected in FIG. 4F, since the corresponding portions 164, 154, 144 are protected by the photoresist 174 remaining in the through hole 112, it must be understood that the circuit pattern 132 is electrically connected to the copper plating layer, etc., in the through hole.

Figure 4G:
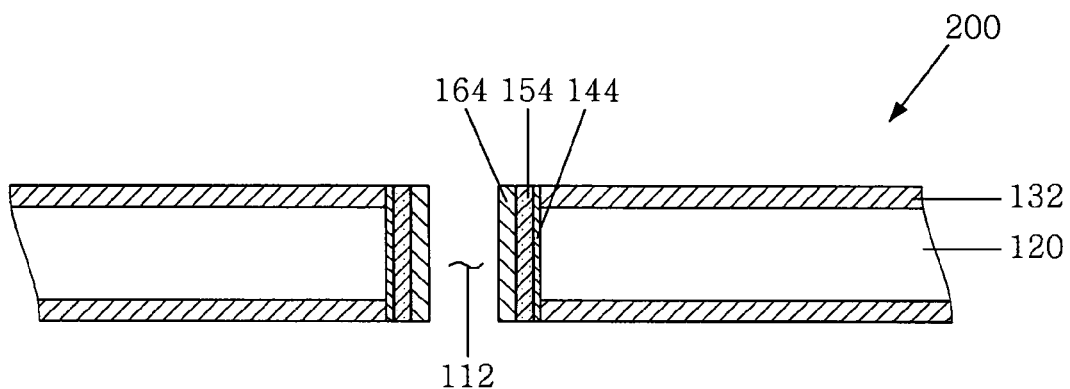
Figure 4H:
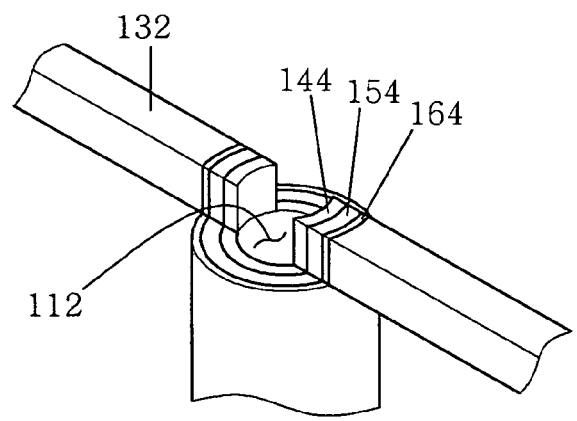

Finally, as shown in FIG. 4G, the photoresist remaining in the through hole 112 is removed, thereby forming a landless hole structure having no upper land (S120). The resulting landless via hole structure is depicted in FIG. 4H.

In the PCB having such a landless via hole structure, since the outer layer circuit pattern is formed using only the copper foil of the CCL, the circuit pattern may be finely formed to an extent of having a width of about 20 μm. Moreover, in the case where the circuit pattern is electrically connected to the copper plating layer which is formed in the through hole, the width thereof may be maintained fine.

Accordingly, in the present invention, a circuit pattern having a fine width is maintained, and a landless via hole structure having no upper land is realized. Ultimately, the PCB of the present invention may have a reliable circuit pattern having a higher density than that of the conventional PCB. For example, in the conventional case, since the thickness of the copper plating layer, which is formed in the through hole, is usually applied to the circuit pattern, the width of the circuit pattern itself is undesirably increased. However, according to the method of the present invention, the circuit pattern is formed using only the copper foil itself, and the copper plating layer is formed in the through hole regardless thereof, thus a fine circuit pattern may be effectively realized.

Although the first embodiment of the present invention is based on the through hole, the present invention is not limited thereto. For instance, according to a second embodiment of the present invention below, the manufacturing method of the present invention may be applied to a blind via hole.

Figure 5:
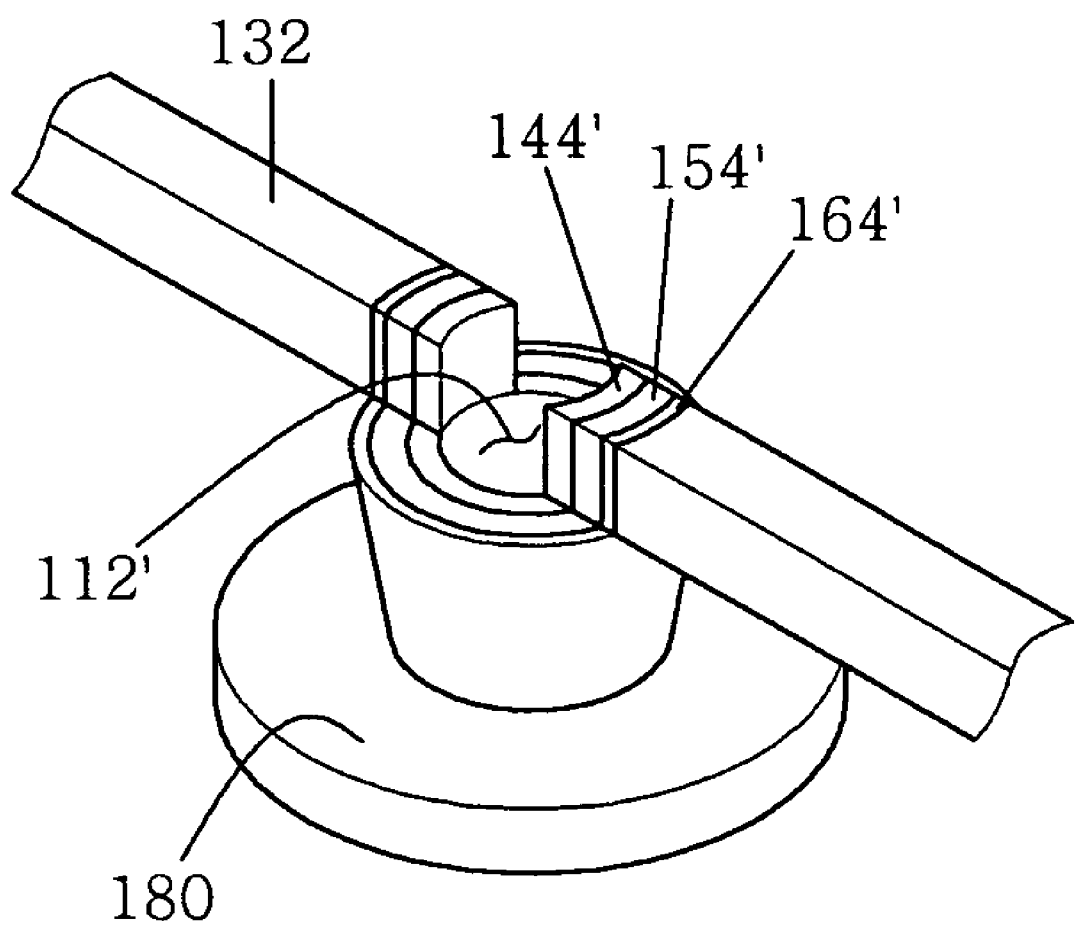
FIG. 5 is a perspective view schematically showing the structure of a blind type landless via hole, according to a second embodiment of the present invention.

FIG. 5 schematically show the blind type landless via hole structure, which is similar to the through hole structure of FIG. 4H. Referring to FIG. 5, unlike the above first embodiment, a blind hole 112' is formed, and a copper plating layer 164', a second metal layer 154' and a seed layer 144' are formed on the inner wall of the blind hole 112' such that they are electrically connected with a circuit pattern 132. In addition, the bottom surface of the blind hole 112' is connected to an inner layer circuit (or a via land) 180, whereby the circuit pattern 132 may be connected to the inner layer circuit 180 through the copper plating layer 164' on the inner wall of the blind hole.

The method of manufacturing the PCB having such a landless via hole structure is briefly described below, with reference to the flowchart of FIG. 6.

Figure 6:
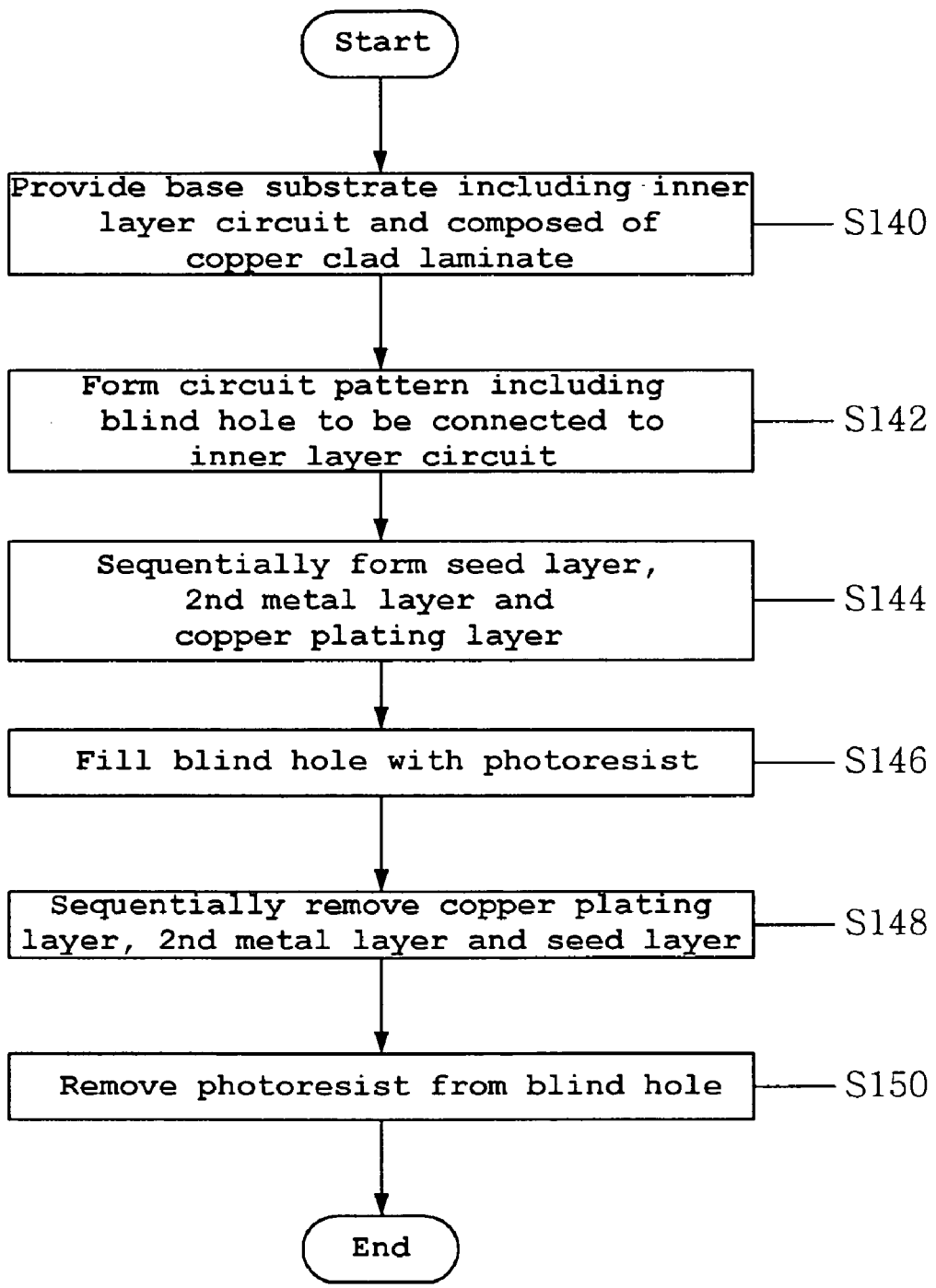
FIG. 6 is a flowchart schematically showing the process of manufacturing the PCB having the blind via structure of FIG. 5.

As shown in FIG. 6, the method of manufacturing the PCB according to the second embodiment of the present invention comprises providing a base substrate including an inner layer circuit and composed of CCL (S140), forming a circuit pattern including a blind hole having the bottom surface thereof connected to the inner layer circuit (S142), sequentially forming a seed layer, a second metal layer, and a copper plating layer (S144), filling the blind hole with a photoresist (S146), sequentially removing the copper plating layer, the second metal layer, and the seed layer while protecting parts of the copper plating layer, the second metal layer, and the seed layer using the photoresist (S148), and removing the photoresist that remains in the blind hole (S150).

The base substrate having the inner layer circuit denotes a multilayered substrate in which a predetermined inner layer circuit is included, or may be provided in a structure in which a plurality of inner layer circuits is formed.

Further, the photoresist used in the second embodiment has the same properties as the above-mentioned photoresist. During the formation of the circuit pattern, the photoresist remains in the blind hole in order to function to protect the copper plating layer, etc., in the blind hole. Finally, the remaining photoresist is removed, thereby completing the PCB.

As mentioned above, the method of manufacturing the PCB according to the present invention is characterized in that a PCB having a landless via hole is manufactured. To this end, the method comprises forming the circuit pattern using only the copper foil, sequentially forming the seed layer, the second metal layer and the copper plating layer thereon, filling the through hole (or blind hole) with a filler such as a photoresist, and sequentially removing such layers, thus minimizing the width of the circuit pattern while realizing a structure having no upper land. In addition, the conductive layers (the copper plating layer, the second metal layer and the seed layer) formed in the through hole (or blind hole) may be prevented from damage, and therefore electrical reliability between the outer layer circuit pattern and the copper plating layer in the through hole may be assured even in a landless via hole structure having no upper land.

Further, unlike the conventional method, in the method of manufacturing the PCB according to the present invention, since the copper plating layer in the through hole is formed separately from the circuit pattern on the surface of the substrate, an increase in the size of the circuit pattern may be avoided, thereby helping realize a fine circuit pattern. Simultaneously, a landless via hole structure having no upper land is realized, therefore leading to a highly dense circuit pattern.

As described hereinbefore, the present invention provides a method of manufacturing a PCB having a landless via hole.

According to the method of manufacturing a PCB having a landless via hole of the present invention, since a circuit pattern is formed using only the copper foil of a CCL, the width of the circuit pattern can be minimized, thus easily forming a fine circuit pattern. Further, since the landless via hole structure is realized, a highly dense circuit pattern can be obtained.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board having a landless via hole, comprising:
    providing a base substrate composed of a copper clad laminate;
    etching part of a copper foil of the copper clad laminate, to thus form a circuit pattern including a through hole;
    sequentially forming a seed layer, a second metal layer having etching conditions different from those of copper, and a copper plating layer on an entire surface of the base substrate having the circuit pattern;
    filling the through hole with a photoresist;
    sequentially removing the copper plating layer, the second metal layer, and the seed layer; and
    removing the photoresist from the through hole,
    wherein the circuit pattern has a predetermined thickness corresponding to that of the copper foil.

2. The method as set forth in claim 1, wherein the predetermined thickness of the circuit pattern is about 12~18 μm.

3. The method as set forth in claim 2, wherein the circuit pattern has a width of about 20 μm.

4. The method as set forth in claim 1, wherein filling the through hole with the photoresist comprises:
    applying the photoresist on the entire surface of the base substrate and in the through hole; and
    exposing the photoresist to a depth corresponding to a thickness thereof, and performing development, to thus remove the photoresist from the surface of the base substrate.

5. The method as set forth in claim 4, wherein the exposing of the photoresist is performed by controlling an exposure amount such that the photoresist is exposed to a depth corresponding to the thickness thereof.

6. The method as set forth in claim 1, wherein the second metal layer is a nickel layer.

7. A method of manufacturing a printed circuit board having a landless via hole, comprising:
    providing a base substrate including an inner layer circuit and composed of a copper clad laminate;
    forming a circuit pattern, having a blind hole which is connected to the inner layer circuit, on a surface of the base substrate;
    sequentially forming a seed layer, a second metal layer having etching conditions different from those of copper, and a copper plating layer on an entire surface of the base substrate having the circuit pattern;
    filling the blind hole with a photoresist;
    sequentially removing the copper plating layer, the second metal layer, and the seed layer; and
    removing the photoresist from the blind hole,
    wherein the circuit pattern has a predetermined thickness corresponding to that of a copper foil of the copper clad laminate.

8. The method as set forth in claim 7, wherein the predetermined thickness of the circuit pattern is about 12~18 μm.

9. The method as set forth in claim 8, wherein the circuit pattern has a width of about 20 μm.

10. The method as set forth in claim 7, wherein filling the blind hole with the photoresist (D) comprises:
   applying the photoresist on the entire surface of the base substrate and in the blind hole; and
   exposing the photoresist to a depth corresponding to a thickness thereof, and performing development, to thus remove the photoresist from the surface of the base substrate.

11. The method as set forth in claim 10, wherein the exposing of the photoresist is performed by controlling an exposure amount such that the photoresist is exposed to a depth corresponding to the thickness thereof.

12. The method as set forth in claim 7, wherein the second metal layer is a nickel layer.

* * * * *

UNITED STATES PATENT AND TRADEMARK OFFICE
CERTIFICATE OF CORRECTION

| | |
|---|---|
| PATENT NO. | : 7,516,545 B2 |
| APPLICATION NO. | : 11/591586 |
| DATED | : April 14, 2009 |
| INVENTOR(S) | : Myung Sam Kang et al. |

Page 1 of 1

It is certified that error appears in the above-identified patent and that said Letters Patent is hereby corrected as shown below:

Column 7, Line 6, after "photoresist" delete "(D)".

Signed and Sealed this

Fourth Day of August, 2009

JOHN DOLL
*Acting Director of the United States Patent and Trademark Office*